(12) United States Patent
Luo et al.

(10) Patent No.: US 8,582,258 B1
(45) Date of Patent: *Nov. 12, 2013

(54) ELECTROSTATIC DISCHARGE PROTECTION CIRCUIT FOR INTEGRATED CIRCUITS

(75) Inventors: Min Yih Luo, San Jose, CA (US); Kyle Terrill, Santa Clara, CA (US); Chrisoph Werres, San Jose, CA (US)

(73) Assignee: Vishay-Siliconix, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/552,205

(22) Filed: Sep. 1, 2009

Related U.S. Application Data

(63) Continuation of application No. 11/190,682, filed on Jul. 26, 2005, now Pat. No. 7,583,485.

(51) Int. Cl.
*H02H 9/00* (2006.01)
*H02H 1/00* (2006.01)
*H02H 1/04* (2006.01)
*H02H 3/22* (2006.01)
*H02H 9/06* (2006.01)

(52) U.S. Cl.
USPC .......................................... 361/56; 361/118

(58) Field of Classification Search
USPC ......................................................... 361/56
See application file for complete search history.

(56) References Cited

U.S. PATENT DOCUMENTS

| | | |
|---|---|---|
| 4,922,371 A | 5/1990 | Gray et al. |
| 5,321,289 A | 6/1994 | Baba et al. |
| 5,416,351 A | 5/1995 | Ito et al. |
| 5,468,667 A | 11/1995 | Diaz et al. |
| 5,502,320 A | 3/1996 | Yamada |
| 5,519,242 A | 5/1996 | Avery |
| 5,545,909 A | 8/1996 | Williams et al. |
| 5,581,104 A | 12/1996 | Lowrey et al. |
| 5,637,898 A | 6/1997 | Baliga |
| 5,637,900 A | 6/1997 | Ker et al. |
| 5,654,574 A | 8/1997 | Williams et al. |
| 5,661,322 A | 8/1997 | Williams et al. |
| 5,677,205 A | 10/1997 | Williams et al. |
| 5,850,095 A | 12/1998 | Chen et al. |
| 5,877,534 A | 3/1999 | Williams et al. |
| 5,998,833 A | 12/1999 | Baliga |
| 5,998,836 A | 12/1999 | Williams |
| 5,998,837 A | 12/1999 | Williams |
| 6,044,018 A | 3/2000 | Sung et al. |
| 6,046,470 A | 4/2000 | Williams et al. |
| 6,049,108 A | 4/2000 | Williams et al. |
| 6,060,752 A | 5/2000 | Williams |
| 6,078,090 A | 6/2000 | Williams et al. |

(Continued)

FOREIGN PATENT DOCUMENTS

| | | |
|---|---|---|
| JP | 05090520 | 4/1993 |
| JP | 2001077314 | 3/2001 |
| JP | 2004247455 | 9/2004 |

*Primary Examiner* — Dharti Patel

(57) ABSTRACT

An electrostatic discharge (ESD) protection circuit for an integrated circuit (IC) that provides ESD protection during an ESD event is disclosed. The electrostatic discharge (ESD) protection circuit includes a first electrostatic discharge (ESD) protection component and a second electrostatic discharge (ESD) protection component coupled in series to the first electrostatic discharge (ESD) protection component. A snapback holding voltage of the electrostatic discharge protection circuit is greater than the operating voltage of the electrostatic discharge protection circuit and a snapback trigger voltage of the electrostatic discharge protection circuit is lower than an oxide breakdown voltage of said integrated circuit.

21 Claims, 9 Drawing Sheets

(56) References Cited

U.S. PATENT DOCUMENTS

| | | | |
|---|---|---|---|
| 6,140,678 A | 10/2000 | Grabowski et al. | |
| 6,255,683 B1 | 7/2001 | Radens et al. | |
| 6,347,026 B1 | 2/2002 | Sung et al. | |
| 6,365,462 B2 | 4/2002 | Baliga | |
| 6,365,941 B1 * | 4/2002 | Rhee | 257/357 |
| 6,514,839 B1 | 2/2003 | Ker et al. | |
| 6,548,860 B1 | 4/2003 | Hshieh et al. | |
| 6,631,060 B2 | 10/2003 | Su et al. | |
| 6,645,802 B1 | 11/2003 | Li et al. | |
| 6,680,833 B2 * | 1/2004 | Morishita | 361/56 |
| 6,855,593 B2 | 2/2005 | Andoh et al. | |
| 6,919,603 B2 * | 7/2005 | Brodsky et al. | 257/361 |
| 7,019,368 B1 | 3/2006 | McCollum et al. | |
| 7,482,218 B1 | 1/2009 | McCollum et al. | |
| 7,544,545 B2 | 6/2009 | Chen et al. | |
| 7,583,485 B1 * | 9/2009 | Luo et al. | 361/56 |
| 2002/0063289 A1 | 5/2002 | Su et al. | |
| 2003/0071310 A1 * | 4/2003 | Salling et al. | 257/355 |
| 2004/0075145 A1 | 4/2004 | Shibib | |
| 2004/0124472 A1 | 7/2004 | Lin et al. | |
| 2005/0036251 A1 | 2/2005 | Mallikarjunaswamy et al. | |
| 2006/0268479 A1 | 11/2006 | Bischof | |

* cited by examiner

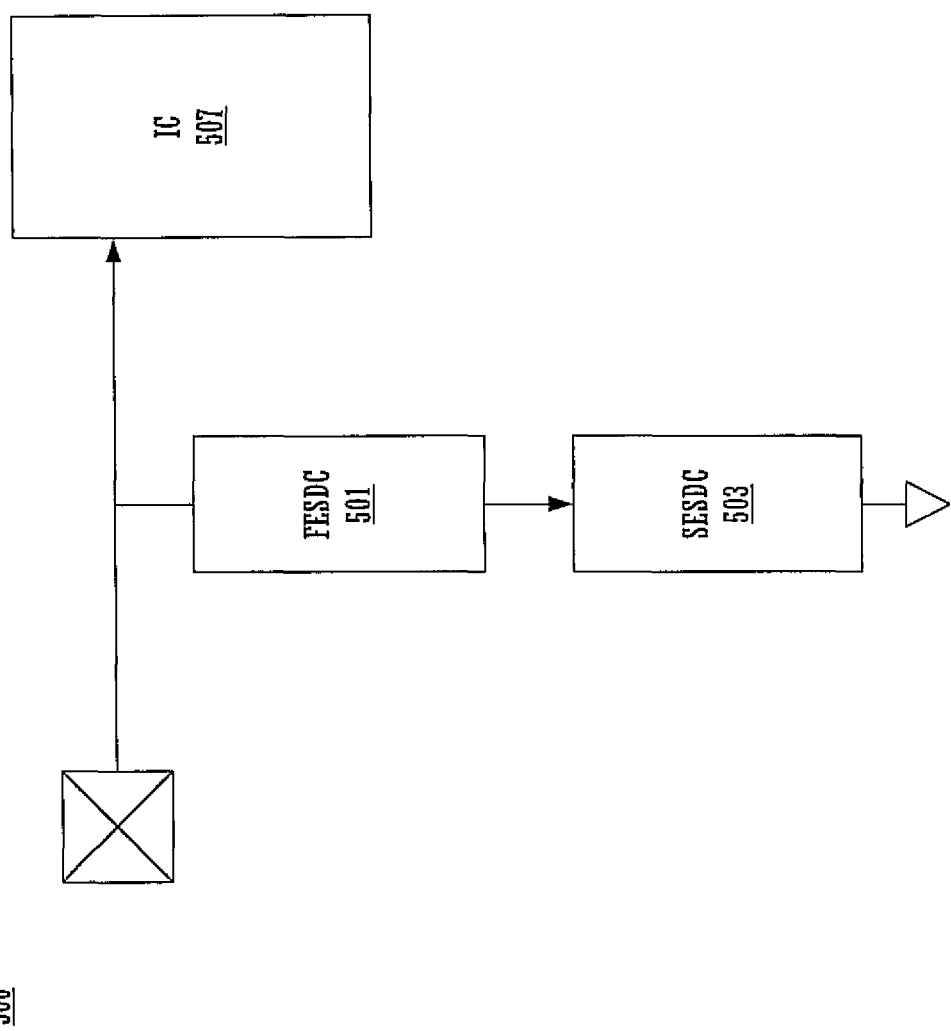

ELECTROSTATIC DISCHARGE PROTECTION CIRCUIT FOR INTEGRATED CIRCUITS

CROSS-REFERENCE TO RELATED APPLICATION

This application is a continuation of U.S. patent application Ser. No. 11/190,682, filed on Jul. 26, 2005, entitled "Electrostatic Discharge Protection Circuit for Integrated Circuits," which is hereby incorporated herein by reference in its entirety.

TECHNICAL FIELD

Embodiments of the invention pertain to electrostatic discharge (ESD) protection circuits for integrated circuits.

BACKGROUND ART

An electrostatic discharge (ESD) event occurs when there is a transfer of energy between bodies that have different electrostatic potentials either through contact or through an ionized ambient discharge. Integrated circuits (ICs) with inadequate ESD protection are subject to catastrophic failure-including ruptured passivation, electrothermal migration, splattered aluminum, contact spiking, and dielectric failure. Sometimes an ESD event can damage a device even though the device continues to function. Damage of this type constitutes latent defects, which are hard to detect and significantly shortens the life of the device.

Integrated circuit (IC) manufacturers employ ESD protection circuits to protect ICs from damage due to ESD caused by the occurrence of an ESD event. A conventional ESD protection circuit 100 is shown in FIG. 1. These devices are used to drain ESD current 103 (divert the potentially damaging charge away from sensitive circuitry 101) upon the occurrence of an ESD event 105. In many cases ESD is received via input pin 107. There are many different types of ESD protection circuits that are currently available.

One shortcoming of conventional ESD protection circuits is their susceptibility to latchup. Latchup is a Significant problem since an IC may stop functioning if ESD causes latchup in the ESD protection circuit. Moreover, the resulting unintentionally sustained supply current may destroy the IC.

Latchup of the ESD protection circuit can occur if the snapback trigger voltage and the snapback sustaining or holding voltage are not properly selected. The snapback trigger voltage and the snapback holding voltage are properly selected if the snapback trigger voltage is selected to be less than the IC oxide breakdown voltage and the snapback holding voltage is greater than the ESD protection circuit operating voltage.

When the holding voltage is less than the ESD protection circuit operating voltage and the MOSFET snapback is triggered, latch up can occur because the snapback condition may be sustained by the higher operating voltage. When the snapback trigger voltage is set too high then damage to the MOSFET can occur if an ESD event causes a voltage that is greater than the oxide breakdown voltage.

FIG. 2 shows a graph of a device whose snapback holding voltage $V_H$ is less than the device operating voltage Vdd. In FIG. 2, the operating voltage Vdd is more than sufficient to sustain the snapback condition. As previously discussed, the resulting unintentionally sustained supply current may cause enough damage to destroy an IC.

IC manufacturers attempt to select MOSFETs that have the proper snapback trigger voltage and the proper snapback holding voltage for use in ESD protection devices for IC applications. However, because this selection process is constrained by the IC manufacturing process and by circuit performance considerations, the optimal combination of snapback trigger voltage and snapback holding voltage is not always available. It should be appreciated that the MOSFET may fail if the operating voltage of the IC is higher than the snapback holding voltage and an operating voltage spike caused by an ESD event drives the MOSFET into a snapback condition that is sustained by the operating voltage. As discussed above, this may lead to a failure of the entire IC.

SUMMARY OF THE INVENTION

Accordingly, a need exists for an electrostatic discharge protection device that exhibits appropriate snapback trigger and snapback holding voltages. Embodiments of the present invention provide a circuit that accomplishes the above-mentioned need.

For instance, one embodiment of the present invention provides an ESD protection device that exhibits a snapback holding voltage that is greater than the electrostatic discharge (ESD) protection device operating voltage and a snapback trigger voltage that is lower than that required to cause damage to the IC. This electronic arrangement avoids latchup due to the snapback holding voltage being lower than the electrostatic discharge (ESD) protection device operating voltage and IC damage due to the snapback trigger voltage being too high.

In one embodiment, an electrostatic discharge (ESD) protection circuit for an integrated circuit (IC) that provides ESD protection during an ESD event is disclosed.

The electrostatic discharge (ESD) protection circuit includes a first electrostatic discharge (ESD) protection component, e.g., a MOSFET device, and a second electrostatic discharge (ESD) protection component, e.g., an integrated Zener diode, coupled in series to the first electrostatic discharge (ESD) protection component. A snapback holding voltage of the electrostatic discharge protection circuit is greater than the operating voltage of the electrostatic discharge protection circuit and a snapback trigger voltage of the electrostatic discharge protection circuit is lower than an oxide breakdown voltage of. the integrated circuit.

These and other advantages of the present invention will no doubt become obvious to those of ordinary skill in the art after having read the following detailed description of the preferred embodiments which are illustrated in the drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

FIG. 5A shows an electrostatic discharge (ESD) protection circuit for an integrated circuit (IC) that provides protection during an ESD event according to one embodiment of the present invention.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they'are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Electostatic Discharge Protection Circuit

Figure 1:
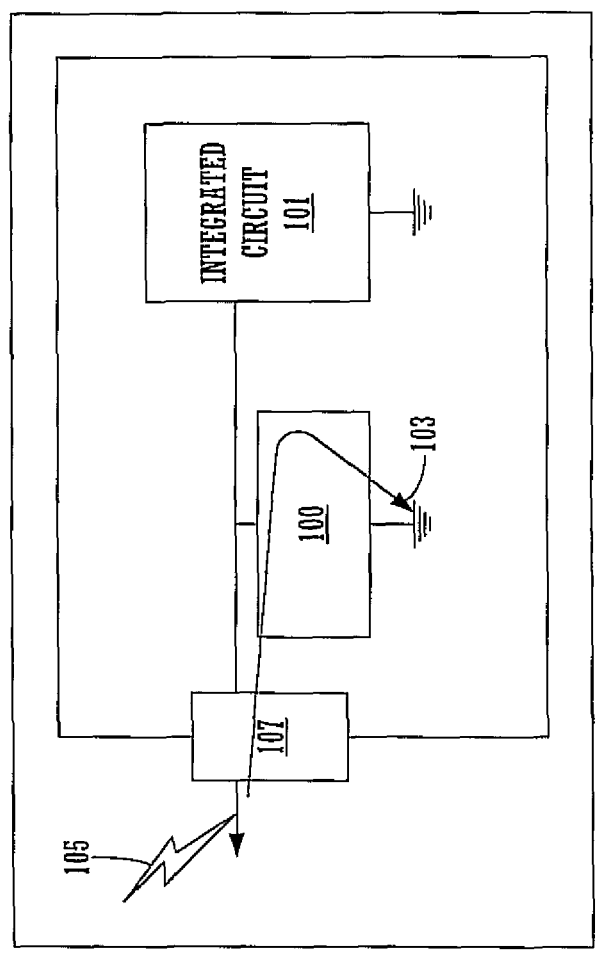
FIG. 1 shows a conventional electrostatic discharge (ESD) protection circuit.
Figure 2:
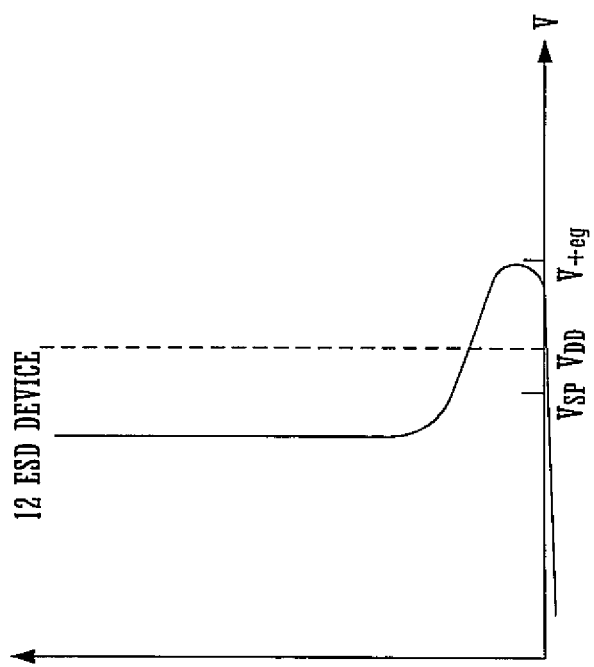
FIG. 2 shows a graph of a conventional electrostatic discharge protection device whose snapback holding voltage is less than the device operating voltage.
Figure 3:
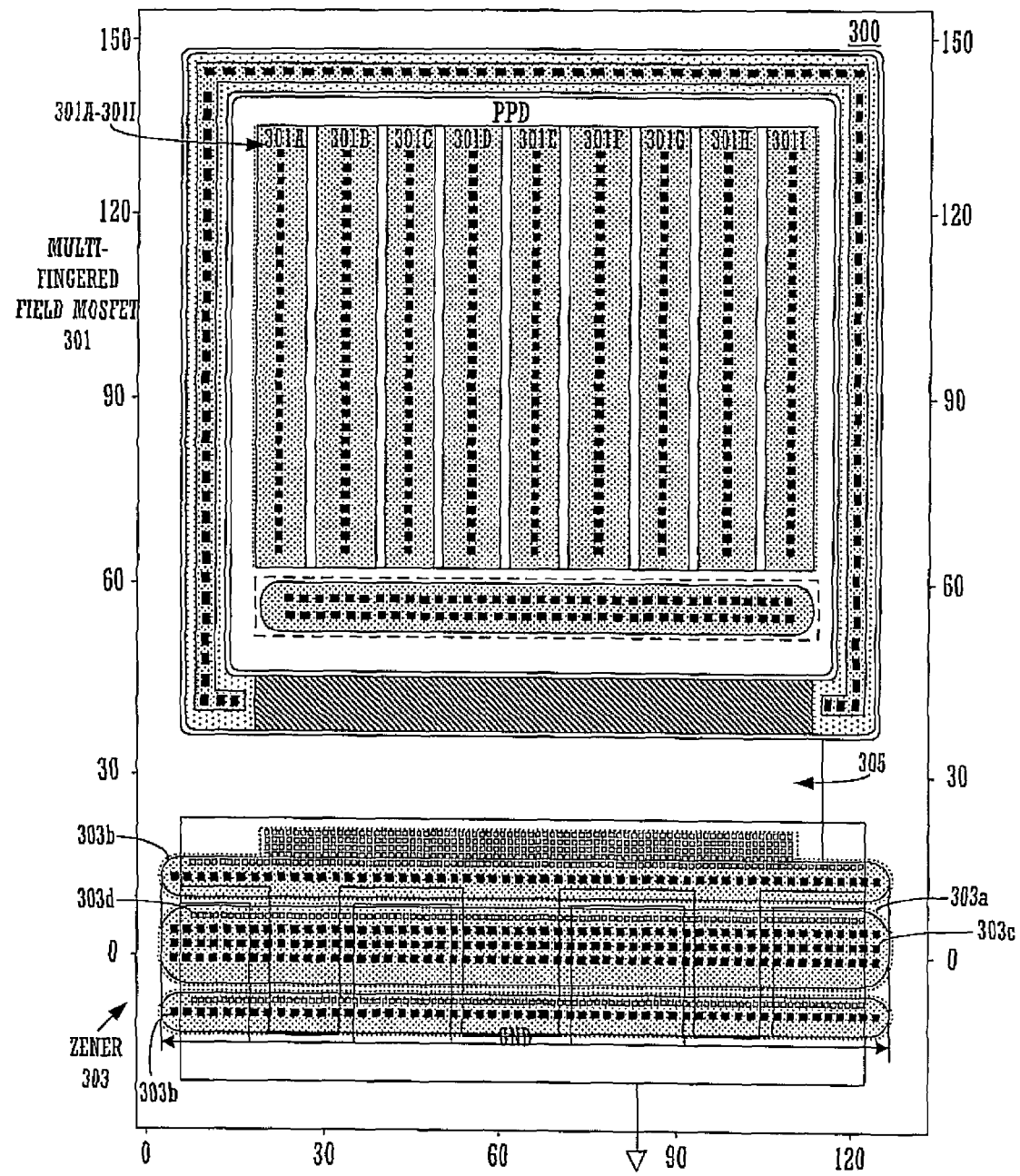
FIG. 3 shows a plan view of an electrostatic discharge (ESD) protection device for an integrated circuit (IC) according to one embodiment of the present invention.

FIG. 3 shows a plan view of an electrostatic discharge (ESD) protection device 300 for an integrated circuit (IC) according to one embodiment of the present invention. In the FIG. 3 embodiment, electrostatic discharge protection device 300 includes multi-fingered field MOSFET 301 and integrated Zener diode 303. ESD protection device 300 exhibits a snapback holding voltage that is greater than the operating voltage of the electrostatic discharge (ESD) protection device 300 and a snapback trigger voltage that is lower than that required to cause damage to the IC. This electronic arrangement avoids latch up due to the snapback holding voltage being lower than the electrostatic discharge (ESD) protection device 300 operating voltage and IC damage due to the snapback trigger voltage being too high.

Multi-fingered MOSFET 301 includes individual multi-fingered elements 301a-301i. In one embodiment, the multi-fingered structure shown in FIG. 3 serves to reduce the on resistance (Ron) of ESD protection device 300. Zener diode 303 includes n-sinker region 303a, n+ region 303b, p+ region 303c and vias 303d. In one embodiment, Zener diode 303 may encompass a structure that is approximately one half the size of the integrated MOSFET. In another embodiment, Zener diode 303 may encompass a structure that may have other dimensions and/or relationships to the size of MOSFET 301.

The use of an integrated Zener diode and MOSFET structure such as is shown in FIG. 3 may ensure that part of the operating voltage is sustained by the Zener diode in conduction mode such that the remaining operating voltage is insufficient to sustain the MOSFET snapback (see discussion made with reference to FIG. 5 herein). As a result, during an ESD event the MOSFET and integrated Zener diode cooperate to drain the ESD induced current, hence serving as an ESD protection device for an associated integrated circuit (IC). After the ESD event, the operating voltage cannot sustain the conduction mode, forcing both devices to shut off, thereby protecting the ESD protection device 300 and the associated IC from damage.

It should be appreciated that although ESD protection device 300 includes integrated MOSFET and Zener diode components, isolation is implemented that provides additional ESD protection (see FIG. 3 above). In the FIG. 3 embodiment, an n-buried layer to n-buried layer region 305 couples the integrated MOSFET and Zener diode components of ESD protection device 300.

Advantages of using a Zener diode in a cascode arrangement with a finger field MOSFET such as shown in the example of FIG. 3 include the facilitation of a slight adjustment in the trigger voltage and the snapback holding voltage as compared to transistor only arrangements, and the beneficial ESD protection properties of the Zener diode and the MOSFET.

Figure 4:
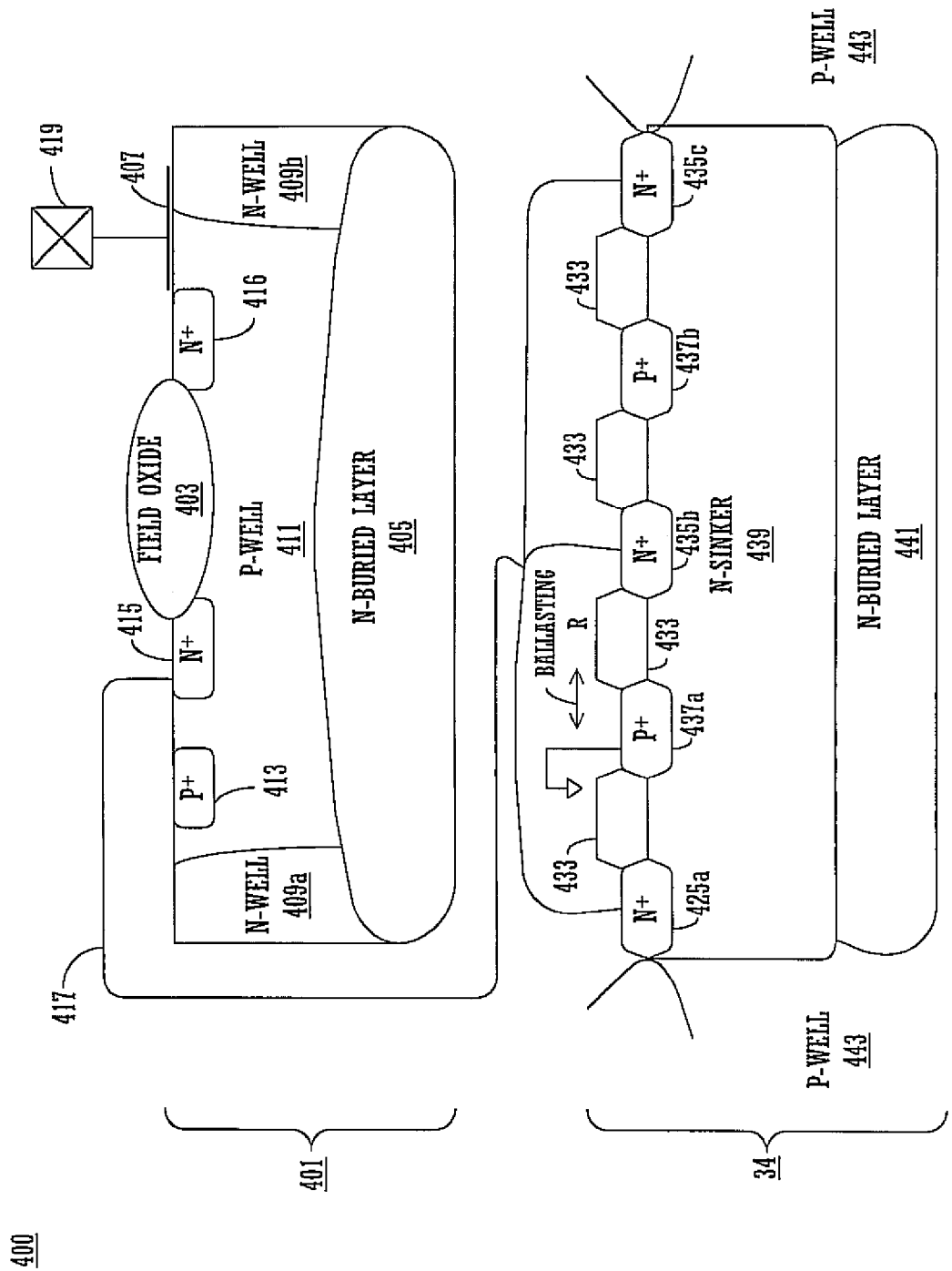
FIG. 4 shows cross-sectional views of MOSFET and Zener diode components of an electrostatic discharge (ESD) protection device according to one embodiment of the present invention.

FIG. 4 shows cross-sectional views of integrated MOSFET and Zener diode components of an electrostatic discharge (ESD) protection device 400 according to one embodiment of the present invention. In the FIG. 4 embodiment, electrostatic discharge (ESD) protection device 400 includes MOSFET structure 401 and Zener diode structure 431.

In the FIG. 4 embodiment, MOSFET 401 includes field oxide 403, n-buried layer 405, multi-fingered field 407, n-well 409a and n-well 409b, p-well 411, p+ region 413, n+ region 415, n+ region 416, signal line 417, and input 419. In one embodiment, n-buried layer 405 is formed below p-well 411. In one embodiment, n-well regions 409a and 409b are formed on both sides of p-well 411 and above n-buried layer 405. In one embodiment, p+ region 413 and n+ region 415 are formed on the surface of the structure within p-well 411. In one embodiment, field oxide region 403 is formed between n+ region 415 and n+ region 416.

In the FIG. 4 embodiment, Zener diode 431 includes oxide regions 433, n+ regions 435a-435c, p+ regions 437a-437b, n-sinker region 439, n-buried layer 441 and p-well regions 443a and 443b. In one embodiment, n-buried layer 441 is formed below n-sinker region 439. In one embodiment, p-well regions 443a and 443b are formed on both sides of n-sinker region 439 and above n-buried layer 441. In one embodiment, p+ regions 437a and 437b and n+ regions 435a-435c are formed on the surface of the structure within n-sinker region 439. In one embodiment, oxide regions 433 are formed between n+ regions 435a-435c and p+ regions 437a and 437b.

Referring to FIG. 4, MOSFET 401 includes a multi-fingered field 407 structure as discussed with reference to FIG. 3. It should be appreciated that the use of a multi-fingered field 407 structure may reduce the devices on resistance (Ron). In addition, in one embodiment, appropriate MOSFET isolation may be facilitated by n-well 409. In one embodiment, although n-well 409 may increase device on resistance (Ron) n-well 409 may enhance ESD protection.

As discussed above, Zener diode 431 includes n-buried layer 441. In one embodiment the n-buried layer 441 may reduce Zener resistance. Moreover, in one embodiment, the width of the p+ region 437a may be adjusted in order to provide an appropriate ballasting resistance. MOSFET 401 and Zener 431 are shown coupled in FIG. 4 by signal line 417.

FIG. 5A shows an electrostatic discharge (ESD) protection circuit 500 for an integrated circuit (IC) 507 that provides protection during an ESD event according to one embodiment of the present invention. In one embodiment, ESD protection circuit 500 exhibits a snapback holding voltage that is greater than the electrostatic discharge (ESD) protection circuit 500 operating voltage and a snapback trigger voltage that is lower than that required to cause damage to the IC. This arrangement avoids latch up due to the snapback holding voltage being lower than the electrostatic discharge (ESD) protection circuit 500 operating voltage and IC damage due to the snapback trigger voltage being too high. In the FIG. 5A embodiment, ESD protection circuit 500 includes a cascade arrangement of first electrostatic discharge (ESD) protection component 501 and second electrostatic discharge (ESD) protection component 503. Also shown in FIG. 5A is input 505 and integrated circuit 507.

Referring to FIG. 5A, first electrostatic discharge (ESD) protection component 501 is coupled to input 505 and may be prompted to turn on upon the occurrence of an ESD event. In one embodiment, first electrostatic discharge (ESD) protection component 501 may in this manner be triggered by the occurrence of the ESD event to drain ESD current. In one embodiment, the snapback trigger voltage and the snapback holding voltage of electrostatic discharge (ESD) protection circuit 500 are set at a point that is higher than the electrostatic discharge (ESD) protection circuit 500 operating voltage. In one embodiment, this is achieved through the series (e.g., cascode) coupling of first electrostatic discharge protection component 501 and second electrostatic discharge protection component 503.

Second electrostatic discharge (ESD) protection component 503 of FIG. 5A is coupled in series with first electrostatic discharge (ESD) protection component 501 and assists in the drainage of ESD current during an ESD event. In one embodiment, the series coupling of the first electrostatic discharge protection component and the second electrostatic discharge (ESD) protection component 503 assures that a portion of the operating voltage that is supplied to the electrostatic discharge protection circuit 500 is sustained by second electrostatic discharge protection component 503. Consequently, the snapback holding voltage of electrostatic discharge protection circuit 500 is partially attributable to second electrostatic discharge protection component 503.

Figure 5B:
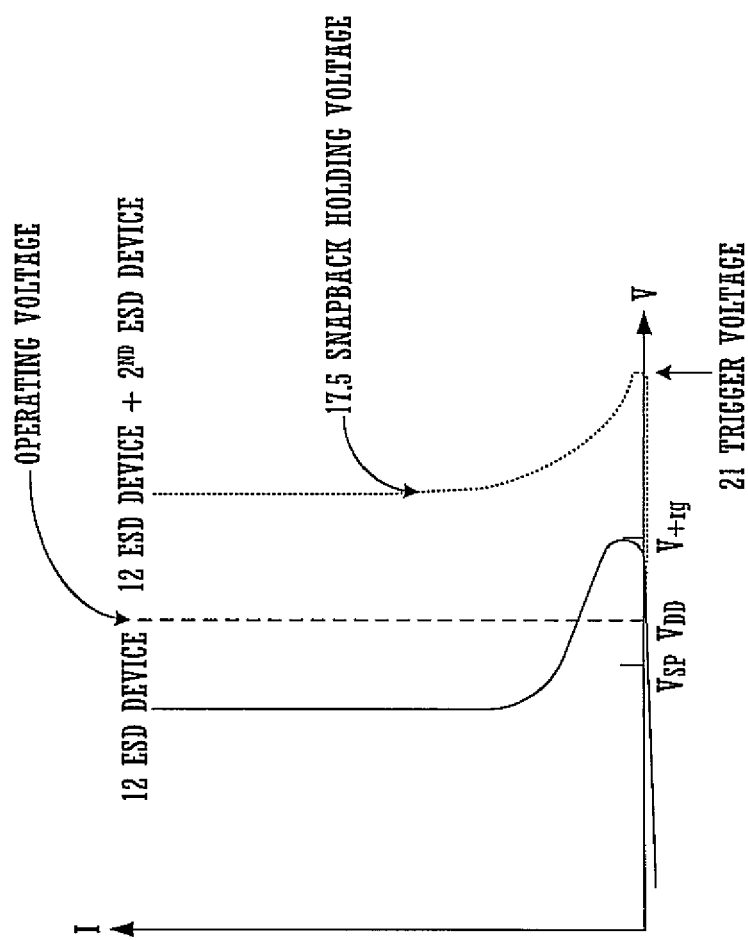
FIG. 5B illustrates that the use of a second electrostatic discharge component can set the snapback holding voltage of an electrostatic discharge protection circuit at a voltage level that is greater than the operating voltage of electrostatic discharge protection circuit.

In one embodiment, because of the series coupling of first electrostatic discharge (ESD) protection component 501 and second electrostatic discharge (ESD) protection component 503 the snapback holding voltage of electrostatic discharge protection circuit 500 may be set beyond the point at which a snapback condition may be sustained by electrostatic discharge protection circuit 500 operating voltage. FIG. 5B is a graph of the snapback characteristic of electrostatic discharge protection circuit 500 according to one embodiment of the present invention. In addition, FIG. 5B shows the snapback characteristics of an electrostatic discharge protection circuit that only employs a single electrostatic discharge component.

FIG. 5B is a graph of current versus voltage that illustrates that the use of the second electrostatic discharge component 503 sets the snapback holding voltage of electrostatic discharge protection circuit 500 at a voltage level (along the horizontal axis) that is greater than the operating voltage Vdd of electrostatic discharge protection circuit 500. Because the snapback holding voltage is greater than the operating voltage Vdd, the operating voltage may not supply a voltage that is sufficient to sustain the snapback condition. Consequently, latchup is avoided. In addition, the snapback trigger voltage is lowered so that voltages are contained well below voltage levels that may cause damage to integrated circuit 507.

In the FIG. 5B embodiment, the exemplary snapback trigger voltage is shown to be 21 volts and the snapback holding voltage is shown to be 17.5 volts. In addition, FIG. 5B shows the snapback characteristic of an electrostatic discharge protection circuit that employs only a single snapback device. FIG. 5B shows that such devices are susceptible to latchup as the snapback holding voltage that is exhibited by them is less than the operating voltage of electrostatic discharge protection circuit.

Figure 5C:
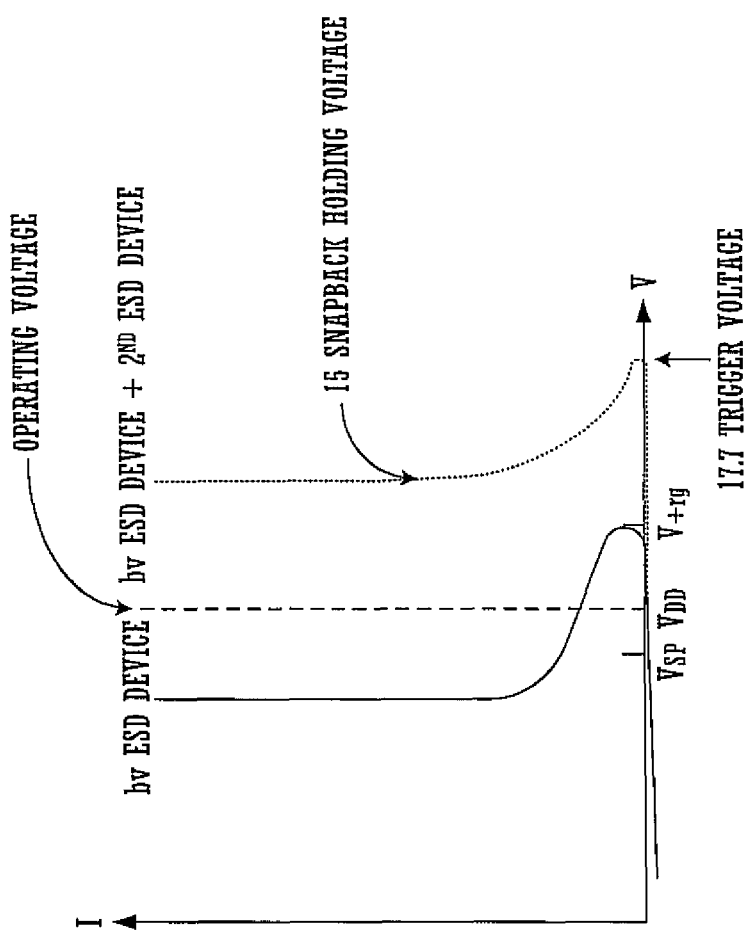
FIG. 5C is a graph that shows the snapback characteristics of an electrostatic discharge protection circuit of an alternate embodiment of the present invention.

FIG. 5C illustrates an alternate embodiment where the trigger voltage is 17.7 volts and the snapback holding voltage is 15 volts. In other embodiments, through the appropriate selection of electrostatic discharge components, other snapback trigger and snapback holding voltages may be established.

It should be appreciated that during an ESD event both first electrostatic discharge (ESD) protection component 501 and second electrostatic discharge (ESD) protection component 503 turn on and act cooperatively to drain ESD energy (ESD current). After the ESD event has ended and the voltage received by ESD protection circuit 500 falls below the snapback holding voltage of electrostatic discharge (ESD) protection circuit 500, both first electrostatic discharge (ESD) protection component 501 and second electrostatic discharge (ESD) protection component 503 are shut off.

Figure 6:
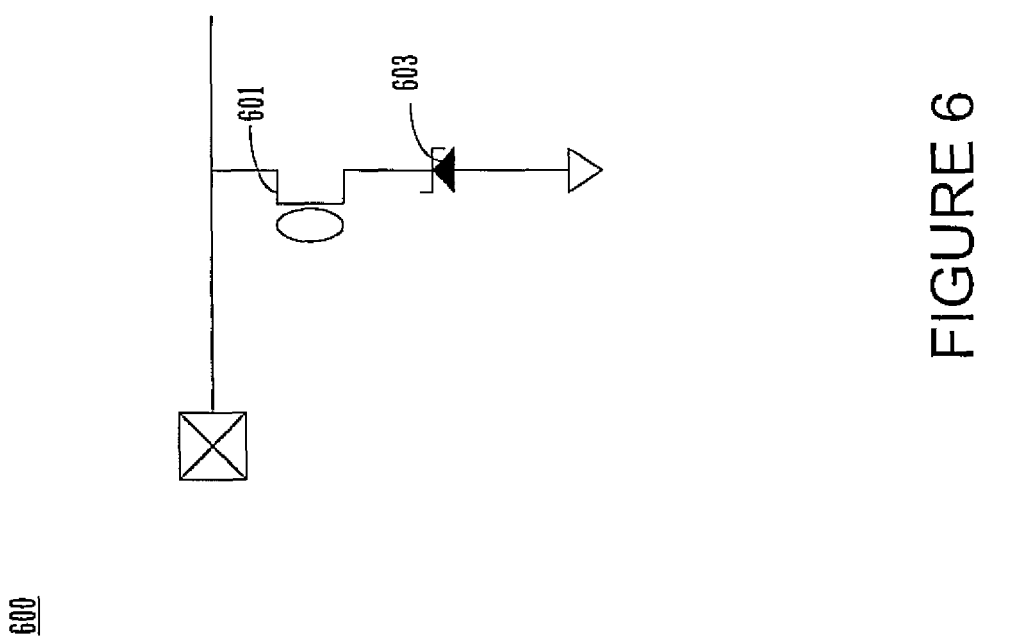
FIG. 6 shows an exemplary schematic of an electrostatic discharge (ESD) protection circuit for an integrated circuit (IC) according to one embodiment of the present invention.

FIG. 6 shows an exemplary electrostatic discharge (ESD) protection circuit 600 for an integrated circuit (IC) according to one embodiment of the present invention. FIG. 6 shows one implementation of the embodiment discussed with reference to FIG. 5. In the FIG. 6 embodiment, ESD protection circuit 600 includes MOSFET 601 and Zener diode 603.

MOSFET 601 turns on upon the occurrence of an ESD event and may in this manner be triggered by the ESD event to drain ESD current. Zener diode 603 is coupled in series to MOSFET 601 and assists in the drainage of ESD current during an ESD event. Zener diode 603 is prompted to turn on upon the occurrence of an ESD event. The series coupled Zener diode 603 ensures that a portion of the operating voltage that is supplied to the electrostatic discharge protection circuit 600 is sustained by the Zener diode 603.

In one embodiment, the operating voltage that is supplied to the electrostatic discharge protection circuit 600 may be insufficient to sustain the MOSFET 601 snapback. After the ESD event has ended both MOSFET 601 and Zener diode 603 are shut off.

In one embodiment, the use of Zener diode 603 sets the snapback holding voltage of electrostatic discharge protection circuit 600 at a voltage level that is greater than operating voltage of electrostatic discharge protection circuit 600 (as discussed with reference to FIG. 5 above). Because the snapback holding voltage level is greater than the operating voltage Vdd, the operating voltage may not supply a voltage that is sufficient to sustain the snapback condition of electrostatic discharge protection circuit 600. Consequently, latchup is avoided. In addition, the trigger voltage is lowered so that voltages are contained well below voltage levels that have the potential to cause damage to an associated integrated circuit.

Figure 7:
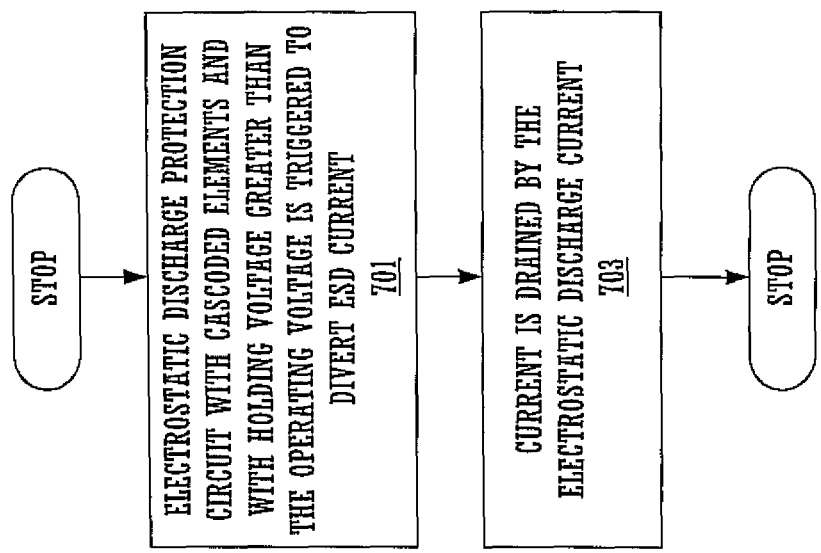
FIG. 7 is a flowchart of steps performed in method of providing ESD protection to integrated circuits in accordance with one embodiment of the present invention.

FIG. 7 is a flowchart of steps performed in method of providing ESD protection to integrated circuits in accordance with one embodiment of the present invention. It should be appreciated that the present invention is well suited to performing various other steps or variations of the steps recited in FIG. 7.

At step 701, electrostatic discharge (ESD) protection circuit is triggered by an ESD event to divert ESD current. In one embodiment, the snapback holding voltage of electrostatic discharge (ESD) protection circuit (e.g., 500 in FIG. 5) is set at a point that is higher than the electrostatic discharge (ESD) protection circuit (e.g., 500 in FIG. 5) operating voltage. In one embodiment, the snapback trigger voltage is set at a point lower than an associated integrated circuit oxide breakdown voltage.

At step 703, ESD current is drained by the electrostatic discharge (ESD) protection circuit (e.g., 500 in FIG. 5) and thereafter electrostatic discharge (ESD) protection circuit is shut off. In one embodiment, the operating voltage of the electrostatic discharge circuit is not sufficient to sustain the snapback holding voltage of the electrostatic discharge (ESD) protection circuit (e.g., 500 in FIG. 5). Consequently, latchup is avoided.

An electrostatic discharge (ESD) protection circuit for an integrated circuit (IC) is disclosed that provides ESD protection during an ESD event. The electrostatic discharge (ESD) protection circuit includes a first electrostatic discharge (ESD) protection component sand a second electrostatic discharge (ESD) protection component coupled in series to the first electrostatic discharge (ESD) protection component. A snapback holding voltage of the electrostatic discharge protection circuit is greater than the operating voltage of the electrostatic discharge protection circuit and a snapback trigger voltage of the electrostatic discharge protection circuit is lower than an oxide breakdown voltage of said integrated circuit.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. An electrostatic discharge (ESD) protection circuit for an integrated circuit (IC), comprising:
    a first electrostatic discharge (ESD) protection component; and
    a second electrostatic discharge (ESD) protection component coupled in series to said first electrostatic discharge (ESD) protection component,
    wherein a first buried layer is formed underneath a p-well region of said first electrostatic discharge protection (ESD) component and a second buried layer region is formed underneath an n-sinker region of said second electrostatic discharge protection (ESD) component and are integrated and coupled via a buried layer to buried layer region.

2. The ESD protection circuit of claim 1 wherein said first electrostatic discharge (ESD) protection component is a transistor.

3. The ESD protection circuit of claim 2 wherein said second electrostatic discharge (ESD) protection component is a Zener diode.

4. The ESD protection circuit of claim 3 powered by an operating voltage wherein a portion of said operating voltage is sustained by said Zener diode when said Zener diode is conducting.

5. The ESD protection circuit of claim 3 wherein said Zener diode is integrated with said transistor.

6. The ESD protection circuit of claim 2 wherein said transistor is a MOSFET.

7. The ESD protection circuit of claim 3 wherein said transistor and said Zener diode are shut off after an ESD event.

8. An electrostatic discharge (ESD) protection circuit for an integrated circuit (IC), comprising:
    a current flow control component; and
    a current flow direction control component coupled in series to said current flow control component,
    wherein a first buried layer is formed underneath a p-well region of said current flow control component and a second buried layer region is formed underneath an n-sinker region of said current flow direction control component and are integrated and coupled via a buried layer to buried layer region wherein a snapback holding voltage of said electrostatic discharge protection circuit is greater than an operating voltage of said electrostatic discharge protection circuit and a snapback trigger voltage of said electrostatic discharge protection circuit is lower than an oxide breakdown voltage of said IC.

9. The ESD protection circuit of claim 8 wherein said current flow control component is a transistor.

10. The ESD protection circuit of claim 9 wherein said current flow direction control component is a Zener diode.

11. The ESD protection circuit of claim 10 powered by an operating voltage wherein a portion of said operating voltage is sustained by said Zener diode when said Zener diode is conducting.

12. The ESD protection circuit of claim 11 wherein said Zener diode is integrated with said transistor.

13. The ESD protection circuit of claim 9 wherein said transistor is a MOSFET.

14. The ESD protection circuit of claim 10 wherein said transistor and said Zener diode are shut off after an ESD event.

15. An integrated circuit (IC) with electrostatic discharge (ESD) protection, comprising:
    an input;
    an integrated circuit die coupled to said input;
    a first electrostatic discharge (ESD) protection component coupled to said input; and
    a second electrostatic discharge (ESD) protection component coupled in series to said first electrostatic discharge (ESD) protection component,
    wherein a first buried layer is formed underneath a p-well region of said first electrostatic discharge protection (ESD) component and a second buried layer region is formed underneath an n-sinker region of said second electrostatic discharge protection (ESD) component and are integrated and coupled via a buried layer to buried layer region wherein a snapback holding voltage of said electrostatic discharge protection circuit is greater than an operating voltage of said electrostatic discharge protection circuit and a snapback trigger voltage of said electrostatic discharge protection circuit is lower than an oxide breakdown voltage of said IC.

16. The integrated circuit of claim 15 wherein said first electrostatic discharge (ESD) protection component is a transistor.

17. The integrated circuit of claim 16 wherein said second electrostatic discharge (ESD) protection component is a Zener diode.

18. The integrated circuit of claim 17 powered by an operating voltage wherein a portion of said operating voltage is sustained by said Zener diode when said Zener diode is conducting.

19. The integrated circuit of claim 17 wherein said Zener diode is integrated with said transistor.

20. The integrated circuit of claim 15 wherein said transistor is a MOSFET.

21. The integrated circuit of claim 17 wherein after said ESD event is ended said transistor and said Zener diode are shut off.

* * * * *